United States Patent
Singer et al.

(10) Patent No.: US 11,611,191 B2
(45) Date of Patent: Mar. 21, 2023

(54) OPTOELECTRONIC COMPONENT AND METHOD FOR PRODUCING AN OPTOELECTRONIC COMPONENT

(71) Applicant: OSRAM OLED GmbH, Regensburg (DE)

(72) Inventors: Frank Singer, Regenstauf (DE); Jörg Erich Sorg, Regensburg (DE)

( * ) Notice: Subject to any disclaimer, the term of this patent is extended or adjusted under 35 U.S.C. 154(b) by 147 days.

(21) Appl. No.: 17/040,412

(22) PCT Filed: Mar. 6, 2019

(86) PCT No.: PCT/EP2019/055597
§ 371 (c)(1),
(2) Date: Sep. 22, 2020

(87) PCT Pub. No.: WO2019/179769
PCT Pub. Date: Sep. 26, 2019

(65) Prior Publication Data
US 2021/0075187 A1    Mar. 11, 2021

(30) Foreign Application Priority Data
Mar. 23, 2018   (DE) .......................... 102018106959.6

(51) Int. Cl.
*H01S 5/02355* (2021.01)
*H01S 5/02257* (2021.01)
(Continued)

(52) U.S. Cl.
CPC ...... *H01S 5/02355* (2021.01); *H01S 5/02216* (2013.01); *H01S 5/02253* (2021.01); *H01S 5/02257* (2021.01)

(58) Field of Classification Search
CPC ........................ H01S 5/02355; H01S 5/02365
(Continued)

(56) References Cited

U.S. PATENT DOCUMENTS

| 2008/0181277 A1 | 7/2008 | Konig et al. |
| 2009/0068387 A1 | 3/2009 | Panzer et al. |

(Continued)

FOREIGN PATENT DOCUMENTS

| CN | 103199177 A1 | 7/2013 |
| DE | 102004062885 A1 | 7/2006 |

(Continued)

OTHER PUBLICATIONS

Ko et al.,"Low Temperature bonding technology for 3D integration", Microelectronics Reliability, 2012, vol. 52, 10 pages.
(Continued)

*Primary Examiner* — Tuan N Nguyen
(74) *Attorney, Agent, or Firm* — MH2 Technology Law Group LLP (57) ABSTRACT

An optoelectronic component is provided that includes a radiation-emitting semiconductor chip, which emits electromagnetic radiation from a radiation exit surface during operation, a carrier comprising at least two first contact points, and a cover including at least two second contact points, wherein the at least two first contact points and the at least two second contact points are electrically conductively and/or thermally conductively connected to one another by a first plurality of nanowires and a second plurality of nanowires, and the nanowires provide a mechanically stable connection between the carrier and the cover. In addition, a method for producing an optoelectronic component is provided.

19 Claims, 6 Drawing Sheets

(51) Int. Cl.
 *H01S 5/02253* (2021.01)
 *H01S 5/02216* (2021.01)

(58) Field of Classification Search
 USPC .................................................... 372/44.01
 See application file for complete search history.

(56) References Cited

U.S. PATENT DOCUMENTS

| | | | |
|---|---|---|---|
| 2011/0053393 | A1 | 3/2011 | Shigihara |
| 2013/0329397 | A1* | 12/2013 | Shimizu ............... F21V 7/26 362/84 |
| 2015/0023378 | A1 | 1/2015 | Groepl et al. |
| 2016/0013374 | A1* | 1/2016 | Dijken ................. F21K 9/90 257/98 |
| 2016/0109072 | A1 | 4/2016 | Yamashita |
| 2016/0285232 | A1 | 9/2016 | Reinert et al. |
| 2018/0062348 | A1 | 3/2018 | Lee et al. |

FOREIGN PATENT DOCUMENTS

| | | |
|---|---|---|
| DE | 102006037198 A1 | 2/2008 |
| DE | 102014202220 B3 | 5/2015 |
| JP | 2000049414 A | 2/2000 |
| JP | 2001177052 A | 6/2001 |
| JP | 2008258547 A | 10/2008 |
| JP | 2013065600 A | 4/2013 |
| JP | 2013254889 A | 12/2013 |
| JP | 2014120635 A | 6/2014 |
| JP | 2016127142 A | 7/2016 |
| JP | 2016127255 A | 7/2016 |
| JP | 2016521435 A | 7/2016 |
| JP | 2016530622 A | 9/2016 |
| WO | 2018030486 A1 | 2/2018 |

OTHER PUBLICATIONS

Wang et al., "Low Temperature Wafer Bonding by Copper Nanorod Array", Electrochemical and Solid-State Letters, 2009, vol. 12, No. 4, 4 pages.

Unknown, "NanoWired", <http://www.nanowired.de/technologie/>, Accessed Apr. 4, 2018, 2 pages.

Migita, Masahi, Notice of Reasons For Rejection (with English Translation) in Japanese Application No. 2020-550108 dated Jan. 4, 2023, 10 pages.

* cited by examiner

OPTOELECTRONIC COMPONENT AND METHOD FOR PRODUCING AN OPTOELECTRONIC COMPONENT

CROSS-REFERENCE TO RELATED APPLICATIONS

This patent application is a national stage entry from International Application No. PCT/EP2019/055597, filed on Mar. 6, 2019, published as International Publication No. WO 2019/179769 A1 on Sep. 26, 2019, and claims priority under 35 U.S.C. § 119 from German patent application 10 2018 106 959.6, filed Mar. 23, 2018, the entire contents of all of which are incorporated by reference herein.

An optoelectronic component is specified. In addition, a method for producing an optoelectronic component is specified.

One object to be solved is to specify an optoelectronic component which is mechanically stable and encapsulated near the radiation exit surface. In addition, a method for producing such an optoelectronic component shall be specified.

These objects are solved by an optoelectronic component with the features of claim 1 and by a method with the steps of claim 19.

Advantageous embodiments of the optoelectronic component and of the method for producing the optoelectronic component are the subject-matter of the respective dependent claims.

According to at least one embodiment, the optoelectronic component comprises a radiation-emitting semiconductor chip, which emits electromagnetic radiation from a radiation exit surface during operation. For example, the radiation-emitting semiconductor chip is an edge-emitting semiconductor laser chip. If an edge-emitting semiconductor laser chip is used as the radiation-emitting semiconductor chip, the optoelectronic component is typically a laser component such as a laser diode. The edge-emitting semiconductor laser chip emits electromagnetic radiation, such as monochromatic and coherent laser light, preferably via a side surface of the semiconductor chip. The side surface of the semiconductor chip is preferably perpendicular to a mounting surface of the semiconductor chip.

According to at least one embodiment, the optoelectronic component comprises a carrier. The carrier contains or consists, for example, of a plastic or a ceramic. The plastic can be an epoxy or a silicone. Preferably, the semiconductor chip is applied to a first main surface of the carrier. Preferably, the carrier has two first contact points.

Preferably, the first contact points are located on the first main surface of the carrier. The semiconductor chip is preferably arranged spaced apart from the at least two first contact points in lateral directions. This is to say that the semiconductor chip does not cover the at least two first contact points.

The carrier can have at least two plated-through holes. The plated-through holes preferably extend completely through the carrier in vertical direction. The vertical direction extends from the first main surface of the carrier to a second main surface of the carrier opposite the first main surface. The plated-through holes can, for example, have the same materials or be made of the same materials that the two first contact points comprise. For example, each of the two first contact points can be located on one of at least two plated-through holes. The contact point is preferably in direct contact with the plated-through hole. It is possible that the semiconductor chip is arranged on one of the at least two plated-through holes. In this case, the semiconductor chip is preferably arranged with an electrically conductive contact on the plated-through hole.

According to an embodiment of the optoelectronic component, the carrier has at least three plated-through holes. Preferably, the first two contact points are arranged each on one of the plated-through holes, while the semiconductor chip is arranged on the plated-through hole which is still provided with a contact point. The semiconductor chip is preferably arranged between the two contact points.

According to at least one embodiment, the optoelectronic component comprises a cover which has at least two second contact points. The second contact points are preferably arranged on the cover. The at least two second contact points of the cover are preferably located opposite the two first contact points of the carrier. This is to say that the first contact points of the carrier are preferably opposite the second contact points of the cover.

The first contact points and/or the second contact points preferably have a metal or are formed from a metal.

For example, the cover contains or consists of a plastic or a ceramic material. The plastic can be an epoxy or a silicone.

According to at least one embodiment, the first contact points and the second contact points are electrically and/or thermally conductively connected to one another by a first plurality of nanowires and a second plurality of nanowires. This is to say that the first plurality of nanowires and the second plurality of nanowires preferably provide an electrically conductive connection between the carrier and the cover.

According to at least one embodiment, the nanowires provide a mechanically stable connection between the carrier and the cover, in particular against shear forces. If, for example, a shear force acts on the carrier or the cover in lateral directions, the connection between the carrier and the cover is preferably not damaged up to a shear force of 12 MPa.

In at least one embodiment, the optoelectronic component comprises a semiconductor chip, which emits electromagnetic radiation from a radiation exit surface during operation, a carrier comprising at least two first contact points, and a cover comprising at least two second contact points, the at least two first contact points and the at least two second contact points being electrically conductively and/or thermally conductively connected to one another by a first plurality of nanowires and a second plurality of nanowires, and the nanowires providing a mechanically stable connection between the carrier and the cover.

A housing of an optoelectronic component, in particular of a laser component, usually comprises a carrier and a cover, which preferably have to be hermetically sealed together. The carrier and cover must be applied to one another with high precision. If the carrier and/or the cover has manufacturing tolerances with regard to its dimensions, a hermetically sealed connection can only be guaranteed with difficulty. A heat dissipation can thus be disturbed. Also, electrically conductive contacts can be interrupted.

An idea of the optoelectronic element described here is, inter alia, that a plurality of nanowires on the side of the carrier and a plurality of nanowires on the side of the cover create an electrically conductive and/or thermally conductive and preferably mechanically stable connection between the carrier and the cover. If the carrier and/or the cover has manufacturing tolerances with regard to its dimensions, these can be compensated advantageously by the dimensions of the nanowires. For example, a semiconductor chip can be electrically contacted and/or thermally contacted through the cover and the carrier via overdetermined multiple connections. These connections can be interrupted by the manufacturing tolerances mentioned above. This can again be compensated advantageously by the dimensions of the nanowires. The nanowires can also provide a hermetically sealed connection. If the nanowires only provide a connection between carrier and cover in some areas, a radiation exit surface of a radiation-emitting semiconductor chip of the optoelectronic element can advantageously be directly encapsulated by an intermediate layer, so that a hermetic structure of the housing is not necessary.

According to at least one embodiment, the first contact points each have a first plurality of nanowires and the second contact points each have a second plurality of nanowires. The first plurality of nanowires and the second plurality of nanowires are preferably inserted into one another along a main direction of extension, so that the mechanically stable connection is mediated.

The nanowires can be arranged over the entire surface of the first contact points and/or over the entire surface of the second contact points. Alternatively, it is possible that the nanowires are arranged in some areas on the first contact points and/or in some areas on the second contact points. For example, the nanowires each have a diameter of between 10 nanometres and 5 micrometres inclusive and preferably between 30 nanometres and 2 micrometres inclusive. For example, a length of the nanowires is between 100 nanometres and 100 micrometres inclusive, preferably between 500 nanometres and 30 micrometres inclusive.

The main direction of extension is preferably substantially parallel to the vertical direction. Substantially parallel means here that the nanowires can have a slope that deviates from the main direction of extension due to the production process. For example, the nanowires form an angle of less than 10° with the main direction of extension.

After being inserted together along the main direction of extension, it is possible that the first plurality of nanowires and the second plurality of nanowires no longer or predominantly no longer run along a directional course. Instead, the first plurality of nanowires and the second plurality of nanowires are generally intertwined with one another. This can advantageously lead to the mechanically stable connection between the first plurality of nanowires and the second plurality of nanowires.

Furthermore, it is possible that after the first plurality of nanowires and the second plurality of nanowires are inserted together, the mechanical connection between the first plurality of nanowires and the second plurality of nanowires will provide a distance between the first contact points and the second contact points. For example, the distance between the first contact points and the second contact points is between 1 micrometre and 20 micrometres inclusive. For example, the distance is defined between the opposing surfaces of the contact points.

According to at least one embodiment, the nanowires have or consist one of the following materials: copper, gold, silver, platinum, nickel, tin. For example, the nanowires have the same materials as the two first and/or second contact points or consist of the same materials.

According to at least one embodiment, the cover comprises a cavity, wherein a side wall of the cover delimiting the cavity surrounds the semiconductor chip. Alternatively or additionally, it is also possible that the cavity is provided in the carrier. For example, the semiconductor chip is partially located within the cavity and/or the cover.

For example, the side wall has an opening in some areas that completely penetrates the side wall in the lateral direction. For example, the semiconductor chip can be partially arranged in the opening. In this case, the semiconductor chip can protrude beyond the cover or the cover and the carrier in the lateral direction.

According to at least one embodiment, a top surface delimiting the cavity of the cover faces the semiconductor chip. The top surface is preferably arranged perpendicular to the radiation exit surface of the semiconductor chip. In this embodiment, the radiation exit surface of the semiconductor chip is preferably arranged substantially perpendicular to the top surface delimiting the cavity. Substantially perpendicular means that the radiation exit surface of the semiconductor chip can have an inclination to the top surface of the cavity due to manufacturing tolerances. For example, the radiation exit surface forms an angle of less than 5° with the top surface of the cavity.

According to at least one embodiment form, the top surface delimiting the cavity has a further second contact point. The further second contact point, for example, faces the semiconductor chip.

According to at least one embodiment form, a third contact point is arranged on a top surface of the semiconductor chip. The third contact point is arranged, for example, on the top surface of the semiconductor chip and faces the further second contact point. The further second contact point and the third contact point are, for example, facing each other.

According to at least one embodiment, the further second contact point and the third contact point are electrically conductively and/or thermally conductively connected to one another by a third plurality of nanowires and a fourth plurality of nanowires. The third plurality of nanowires and the fourth plurality of nanowires preferably provide an electrically conductive and/or thermally conductive connection between the cover and the semiconductor chip. In addition, the connection between the cover and the semiconductor chip can be thermally conductive.

According to at least one embodiment, a distance from the further second contact point to the third contact point is different from the distance of the at least two first contact points to the at least two second contact points, for example, due to manufacturing tolerances. The distance is for example the distance in vertical direction of the contact points located opposite to one another. The difference in the distances is, for example, between 1 micrometre and 20 micrometres inclusive. For example, the distance from the second further contact point to the third contact point is greater than the distance from the at least two first contact points to the at least two second contact points.

According to at least one embodiment, the semiconductor chip is arranged on a mounting element. Here the semiconductor chip is preferably arranged on the mounting element with an electrically conductive electrical contact. The mounting element contains or consists of a metal, for example. The metal can preferably be copper tungsten, silicon carbide or aluminium nitride.

According to at least one embodiment, the mounting element has a fourth contact point on a side facing away from the semiconductor chip. The fourth contact point preferably faces the carrier.

According to a further embodiment, the carrier has a further first contact point. The further first contact point preferably faces the fourth contact point. The fourth contact point and the further first contact point are preferably facing each other. Preferably, the further first contact point is located on one of the plated-through holes of the carrier and is in direct contact with it. In this case, the further first contact point is preferably electrically connected to the plated-through hole.

According to at least one embodiment, the further first contact point and the fourth contact point are electrically conductively and/or thermally conductively connected to one another by a fifth plurality of nanowires and a sixth plurality of nanowires. The fifth plurality of nanowires and the sixth plurality of nanowires preferably provide an electrically conductive and/or thermally conductive connection between the mounting element and the carrier.

According to at least one embodiment, an electrically conductive and/or thermally conductive coating covers at least in some areas an inner side of the cover facing the carrier. The second contact points and the further second contact point are preferably parts of the coating. The coating can be configured to be continuous and can connect the second contact points and the further second contact point in an electrically conductive and/or thermally conductive manner. The coating preferably comprises areas which correspond to the second contact points and the further second contact point. The areas are preferably located opposite the first contact points and the third contact point.

According to at least one embodiment, the cover has a frame, which laterally surrounds the semiconductor chip, and the cover has a cover plate which is arranged on the frame. The cover can therefore be constructed in several parts. For example, the frame surrounds the semiconductor chip like a frame. The term "frame-like" is not to be understood as restricting the shape and course of the frame. The frame can be rectangular, polygonal, round or oval, for example.

For example, the frame and the cover plate are in direct contact in some areas. For example, one of the following materials is suitable for the frame and the cover plate: Al2O3, AlN, Si, glass or sapphire. Preferably, the frame has the same material as the cover plate or is formed of the same material.

For example, the frame has an opening in some areas that completely penetrates the frame in lateral directions. For example, the semiconductor chip or the semiconductor chip and the mounting element can be partially located in the opening. In this case, the semiconductor chip can protrude beyond the cover or the cover and the carrier in lateral directions. In this case, the radiation exit surface is located outside the opening.

According to at least one embodiment, a contact completely penetrates the frame in vertical direction. The contact connects at least one of the second contact points and the further second contact point electrically conductively and/or thermally conductively with one another. The contact is preferably completely surrounded by the frame. The second contact points can be arranged on the surface of the frame facing the carrier. The contact is preferably electrically conductively and/or thermally conductively connected with one of the second contact points. The further second contact point can be arranged on the cover plate facing the semiconductor chip and can extend to the top surface of the frame. There, the further second contact point is preferably electrically conductive and/or thermally conductive connected to the contact.

The coating already described above is, for example, arranged in some areas on the cover plate facing the semiconductor chip and is preferably electrically conductively and/or thermally conductively connected with the contact.

Alternatively, it is possible that the coating is arranged in some areas on the cover plate facing and facing away from the semiconductor chip. In this case, the cover plate preferably has at least two further contacts, which completely penetrate the cover plate in the vertical direction. The contact of the frame is preferably electrically conductively and/or thermally conductively connected to one of the two further contacts. The coating facing the semiconductor chip is preferably electrically conductively and/or thermally conductively connected to the other of the two further contacts. The coating facing away from the semiconductor chip is preferably electrically conductively and/or thermally conductively connected to both further contacts.

The contacts can, for example, have the same materials or consist of the same materials, which comprise the first two contact points.

According to at least one embodiment, the cover plate is transparent to visible light. For example, the cover comprises glass or sapphire or is made of one of these materials. Advantageously, the transparent cover can be better adjusted over the carrier.

According to at least one embodiment, the inner surface of the cover is completely covered by the coating. The inner surface of the cover is, for example, the surface of the cover facing the cavity and the carrier. The coating preferably connects the second contact points and the further second contact point in an electrically conductive and/or thermally conductive manner. The coating is particularly preferably in direct contact with the cover.

According to at least one embodiment, the radiation-emitting semiconductor chip is an edge-emitting semiconductor chip. An edge-emitting semiconductor laser chip, for example, is configured to emit the laser radiation generated during operation in a direction parallel to an active, radiation-generating zone of the semiconductor laser chip. The radiation exit surface preferably comprises a facet or is configured as a facet. The radiation exit surface can be a sub-region of the facet and is preferably limited to the facet. For example, the facet is oriented perpendicular or substantially perpendicular to the active zone. Substantially perpendicular means that the facet can have a slope due to the manufacturing process.

According to at least one embodiment, an optical element is attached to the radiation exit surface of the edge-emitting semiconductor laser chip by means of an intermediate layer. The intermediate layer can also be arranged on the cover and/or the carrier. The intermediate layer is preferably transparent to the laser radiation emitted by the semiconductor laser chip during operation and contains or consists of a polysiloxane, a silicone derivative or a glass, for example. Advantageously, the intermediate layer forms a protective layer for the radiation exit surface and thus for the facet and preferably acts as a diffusion barrier against oxygen and/or water vapor.

The optical element can be a lens configured to collimate or focus the radiation generated during operation of the semiconductor chip. The lens can be spherical, aspherical or free-form. Furthermore, the lens can be configured as a cylindrical lens, semi-cylindrical lens, plano-convex lens, biconvex lens or Fresnel lens. The optical element contains or consists, for example, of sapphire, glass or silicon carbide.

A side surface of the optical element facing the radiation exit surface is preferably flat. Via the side surface, the optical element is mechanically stately connected to the semiconductor chip by means of the intermediate layer. Advantageously the radiation exit surface is protected from chemical or mechanical damage by the optical element and the intermediate layer. It is also possible that the optical element is fixed to the cover and/or the carrier by means of the intermediate layer.

According to at least one embodiment, a micro resonator is embedded in the intermediate layer. Embedded can mean that the micro resonator is in contact with the intermediate layer, is partially inside the intermediate layer and/or is enclosed by the intermediate layer on at least a part of its outer surface.

The micro resonator is preferably positioned in front of the radiation exit surface. This is to say that the radiation generated during operation emerges from the radiation exit surface through the micro resonator. The micro resonator can generate a narrow-band resonance, which is used to stabilize the semiconductor laser. The bandwidth of the radiation emitted by the micro resonator is preferably in the sub-kHz or sub-MHz range. The micro resonator contains or consists, for example, of a glass or a silicate.

According to at least one embodiment, an outer surface of the optical element is covered with a conversion layer. The conversion layer is configured to convert the electromagnetic radiation of the semiconductor chip at least partially into electromagnetic radiation of another wavelength range. The conversion layer has, for example, a conversion material which preferably comprises a matrix material into which phosphor particles are incorporated. The matrix material can be a resin such as an epoxy or a silicone or a mixture of these materials. The phosphor particles give the conversion material and thus the conversion layer the wavelength converting properties.

For example, one of the following materials is suitable for the phosphor particles: rare earth doped garnets, rare earth doped alkaline earth sulphides, rare earth doped thiogallates, rare earth doped aluminates, rare earth doped silicates, rare earth doped orthosilicates, Rare earth doped chlorosilicates, rare earth doped alkaline earth silicon nitrides, rare earth doped oxynitrides, rare earth doped aluminium oxynitrides, rare earth doped silicon nitrides, rare earth doped sialons, quantum dots. These materials can also be used without matrix material and applied directly. The conversion layer can then consist of one of the materials.

According to at least one embodiment, the optoelectronic component comprises a dielectric filter and a holder. Preferably, the dielectric filter is used together with a conversion element. The dielectric filter is preferably transparent to the electromagnetic radiation of the semiconductor chip and opaque to the converted radiation of the conversion element. The dielectric filter preferentially has a high transmittance for the wavelength range of the electromagnetic radiation of the semiconductor chip, while the wavelength range of the converted electromagnetic radiation is preferentially reflected or absorbed. Alternatively, the dielectric filter preferably has a low transmittance for the wavelength range of the converted electromagnetic radiation, while the wavelength range of the electromagnetic radiation of the semiconductor chip is transmitted.

The holder is preferably configured to enclose the optical element and/or further elements in some areas. The holder can be used to attach the optical element and/or the further elements to the carrier and/or the cover. The holder can be configured to reflect the electromagnetic radiation emitted by the semiconductor chip and/or the converted electromagnetic radiation. A reflective layer can be arranged on an inner surface of the holder facing the optical element. The reflective layer contains or consists, for example, of a metal such as Ag, Al, Al:Cu, Rh, Pd, Pt. Furthermore, the reflective layer can also comprise a TCO (short for "transparent conductive oxide") such as ITO (short for indium tin oxide) or be formed from a TCO such as ITO. Furthermore, the reflective layer can also be formed as a dielectric mirror, for example, comprising alternating layers of silver and silicon oxide.

According to at least one embodiment, the holder has a radiation entrance surface and a radiation exit surface. For example, the holder has a first opening opposite the radiation exit surface of the semiconductor chip, which forms the radiation entrance surface of the holder. Furthermore, the holder has a second opening opposite and/or downstream of the first opening. The radiation exit surface can be formed by the further opening.

According to at least one embodiment, the dielectric filter is arranged on the radiation entrance surface of the holder or the radiation exit surface of the holder. If the dielectric filter is arranged on the radiation entrance surface of the holder, the filter is located between the holder and the intermediate layer and is preferably in direct contact with both. If the dielectric filter is located at the radiation exit surface, it is preferably in direct contact with the optical element.

According to at least one embodiment, a conversion element is arranged on the radiation exit surface of the holder, which at least partially converts electromagnetic radiation of the semiconductor chip into electromagnetic radiation of another wavelength range. The conversion element can contain or consist of the same conversion materials as the conversion layer.

For example, the conversion element is arranged above the second opening of the holder. The dielectric filter, for example, is then arranged between the conversion element and the optical element. Alternatively, the conversion element can be in direct contact with the optical element.

According to at least one embodiment, the carrier protrudes laterally beyond the radiation exit surface of the semiconductor chip. The holder and the carrier are preferably thermally conductively connected to one another by a seventh plurality of nanowires and an eighth plurality of nanowires. The holder preferably has a sixth contact point and the carrier preferably has a seventh contact point, which is arranged on the part of the carrier protruding beyond the radiation surface of the semiconductor chip. The sixth contact point is preferably arranged opposite the seventh contact point.

The sixth contact point preferably has the seventh plurality of nanowires and the seventh contact point preferably has the eighth plurality of nanowires. The seventh plurality of nanowires and the eighth plurality of nanowires are preferably inserted into one another and, for example, provide a thermally conductive connection between the holder and the carrier. Advantageously, the holder can be additionally cooled by the connection.

The contact points described here can preferably have the same materials or consist of the same materials. For example, one of the following materials is suitable for the contact points described here: copper, gold, silver, platinum, nickel, tin.

In addition, an electrical contact resistance of the connection mediated by nanowires is, for example, less than 1 Ohm. A thermal conductivity of the connection mediated by nanowires is for example greater than 300 W/(m*K) (Watt/(meter*Kelvin).

In addition, a method for producing an optoelectronic component is specified, with which an optoelectronic component described here can be produced. All features and embodiments disclosed in connection with the optoelectronic component are therefore also applicable in connection with the method and vice versa.

According to at least one embodiment form of the method, a carrier with at least two first contact points is provided.

The at least two first contact points can be applied to the carrier, for example, by gluing, bonding or soldering.

According to at least one embodiment of the method, a radiation-emitting semiconductor chip, which emits electromagnetic radiation from a radiation exit surface during operation, is applied to the carrier. The semiconductor chip preferably comprises at least one chip contact surface, which can, for example, contain a metal or consist of a metal. The chip contact surface can be applied to a plated-through hole of the carrier, for example, by gluing, bonding or soldering.

According to at least one embodiment of the method, a cover comprising at least two second contact points is applied to the carrier. The at least two second contact points are preferably positioned above the at least two first contact points.

The cover can comprise a frame and a cover plate. The frame and the cover plate can be formed, for example, by layers of co-fired ceramics and the frame and cover plate may be soldered. It is also possible that the frame and the cover plate are anodically bonded.

According to at least one embodiment of the method, the at least two first contact points and two second contact points are electrically and/or thermally conductively connected to one another by a first plurality of nanowires and a second plurality of nanowires. The first plurality of nanowires and the second plurality of nanowires are preferably applied to the at least two first contact points and to the at least two second contact points by means of an electroplating process. Further nanowires can, for example, be applied analogously to further contact points.

A filter foil is preferably applied to the respective contact point, which for example has a thickness between 200 micrometres and 500 micrometres inclusive. The filter foil preferably comprises a plurality of openings, which completely penetrate the filter foil. The openings preferably have a diameter of 30 nanometres up to and 2 micrometres inclusive. The material of the nanowires can be introduced into the openings by an electroplating process. After this process the filter foil is removed, resulting in a plurality of nanowires.

The cover is preferably pressed onto the carrier with a defined pressure, wherein the at least two first and second contact points connect with one another. Here, the pressure preferably acts on the cover in a vertical direction. The pressure to be applied is between 1 MPa and 50 MPa inclusive.

The nanowires are preferably inserted into one another along a main direction of extension. Preferably the first plurality of nanowires and the second plurality of nanowires intertwine by applying a defined force. This is to say that the nanowires do not show a directional course after being pushed into one another.

The connection process of the nanowires can preferably be carried out at room temperature, so that the semiconductor chip is not exposed to thermal stress.

During the connection process, the nanowires are preferably pressed together at room temperature with a pressure in the vertical direction of between 1 MPa and 50 MPa inclusive for a period of between 0.5 s and 5 s inclusive.

In the following, the optoelectronic component described here as well as the method described here are explained in more detail using exemplary embodiments and the associated Figures.

They show.

Identical, similar or similarly acting elements are provided with the same reference signs in the Figures. The Figures and the proportions of the elements shown in the Figures to one another are not to be regarded as true to scale. Rather, individual elements may be oversized for better representability and/or comprehensibility.

Figure 1A:
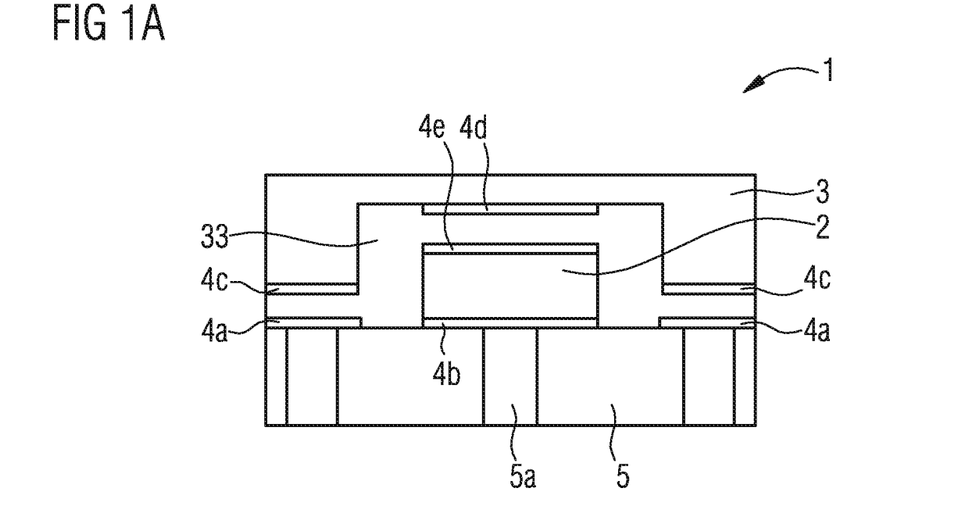
FIGS. 1A and 1B schematic sectional views of method steps of a method for producing an optoelectronic component according to an exemplary embodiment, FIGS. 2A and 2B schematic sectional views of an optoelectronic component, each according to an exemplary embodiment, FIGS. 3A, 3B and 3C schematic sectional views of an optoelectronic component, each according to a further exemplary embodiment, FIGS. 4A, 4B, 4C, 5, 6, 7, 8, 9 and 10 schematic sectional views of an optoelectronic component, each according to an exemplary embodiment each.

According to FIG. 1A, a carrier 5 and a cover 4 are provided in the first step of the process. The cover 4 is formed in one piece. Two first contact points 4a are arranged on the carrier 5. A further first contact point 4b is arranged on the carrier 5 between the two first contact points 4a. In addition, two second contact points 4c are arranged on the cover 3. Between the two second contact points 4c a further second contact point 4d is arranged on the cover 5. The first contact points 4a, 4b of the carrier 5 are opposite the second contact points 4c, 4e of the cover 3.

The carrier 5 has plated-through holes 5a which penetrate the carrier 5 completely. The first contact points 4a and the further first contact point 4b are each located on one of the plated-through holes 5a.

The first contact points 4a have a distance in vertical direction to the second contact points 4c which is equal to a distance of the third contact point 4e to the further second contact point 4d.

In a next process step, a radiation-emitting semiconductor chip 2 is applied (not shown) to the carrier, which has a third contact point 4e being located opposite the further second contact point 4d. The semiconductor chip 2 is arranged on the further second contact point 4b. The cover 3 has a cavity 33, which surrounds a side surface of the semiconductor chip 2 in some areas like a frame.

In a next process step, a first plurality of nanowires 6a is applied to each of the first contact points 4a and a second plurality of nanowires 6b is applied to each of the second contact points 4c. In addition, a third plurality of nanowires 6c is applied to the further second contact point 4d and a fourth plurality of nanowires 6d is applied to the third contact point 4e. In each case the first and second plurality of nanowires 6a and 6b face each other. The third and fourth pluralities of nanowires 6c and 6d also face each other.

Figure 1B:
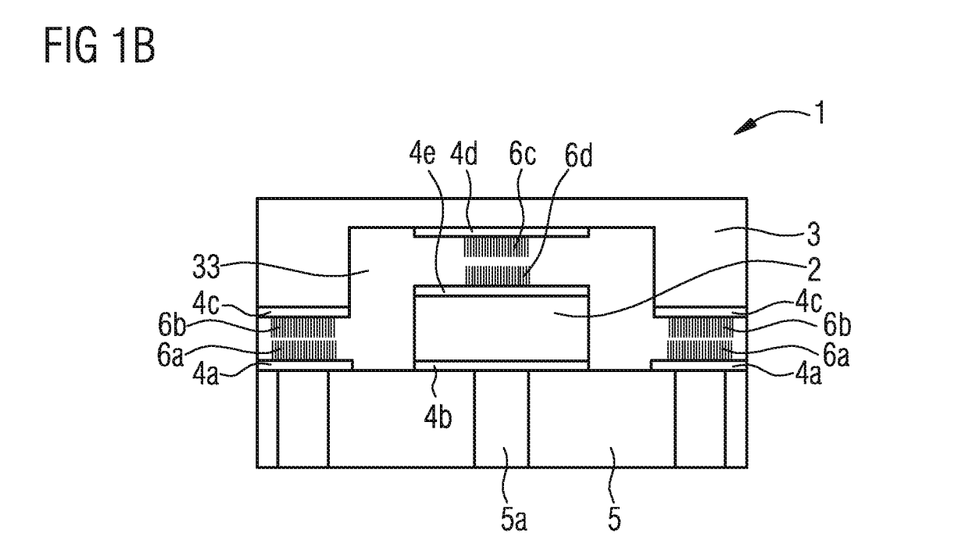

According to FIG. 1B, the cover and the carrier are applied to one another. The nanowires located opposite to one another are inserted into one another and form an electrically conductive and/or thermally conductive and mechanically stable connection.

Figure 2A:
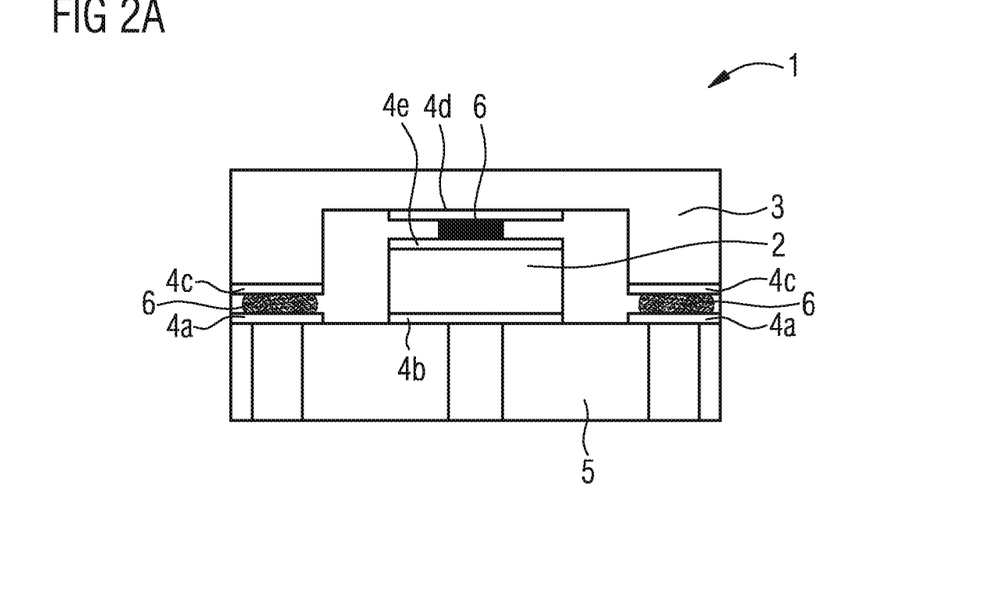

The exemplary embodiment shown in FIG. 2A differs from the exemplary embodiment shown in FIG. 1B in that the cover 2 is applied to the carrier 5.

The first and second pluralities of nanowires 6a, 6b and the third and fourth pluralities of nanowires 6c, 6d are thereby pushed into one another with a defined force, whereby the first and second pluralities of nanowires 6a, 6b and the third and fourth pluralities of nanowires 6c, 6d are connected to one another, respectively. The respective connection 6 is configured to be electrically conductive and/or thermally conductive and provides a mechanically stable connection between the carrier 5 and the cover 3. Due to the connection, the nanowires 6a, 6b, 6c, 6d are no longer oriented perpendicular to the main plane of extension. Instead, the first and second plurality of nanowires 6a, 6b and the third and fourth plurality of nanowires 6c, 6d are intertwined.

Figure 2B:
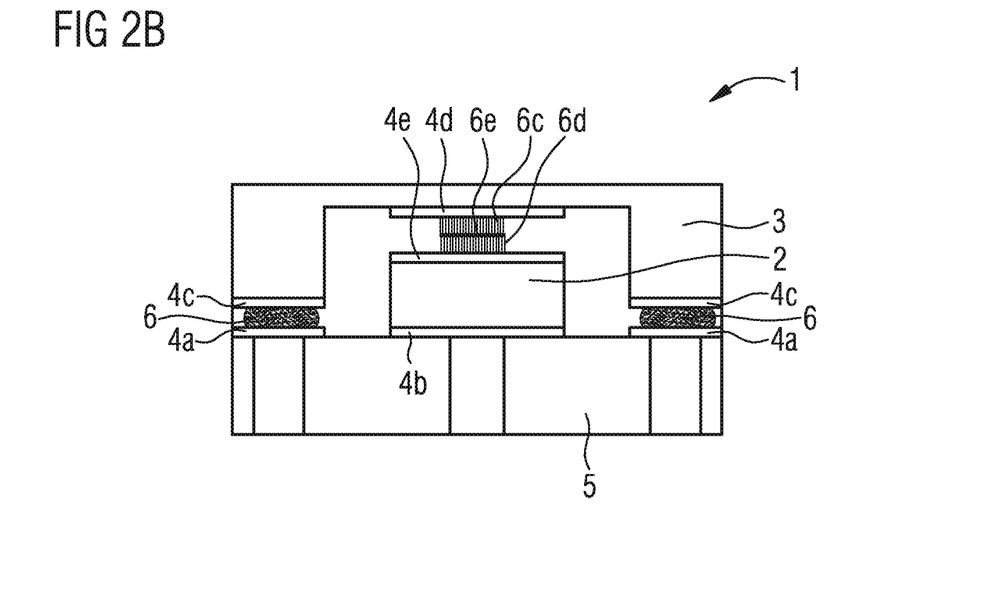

The exemplary embodiment shown in FIG. 2B differs from the exemplary embodiment shown in FIG. 2A in that the distance of the first contact points 4a to the second contact points 4c is smaller than the distance of the third contact point 4e to the further second contact point 4d. The mechanically stable connection 6 between the first and second contact points 4a, 4c is completely formed and the first and second plurality of nanowires 6a, 6b are intertwined. Since the distance between the third contact point 4e to the further second contact point 4d is greater, the third and fourth plurality of nanowires 6c, 6d are only partially intertwined and form the connection 6e. The third and fourth plurality of nanowires 6c, 6d are partially arranged perpendicular to the main plane of extension and partially connected to one another. Nevertheless, the third and fourth plurality of nanowires 6c, 6d which are inserted into one another form an electrically conductive and/or thermally conductive connection 6e. The mechanically stabilizing connection is thereby the connection 6 between the first and second contact points 4a, 4c.

Figure 3A:
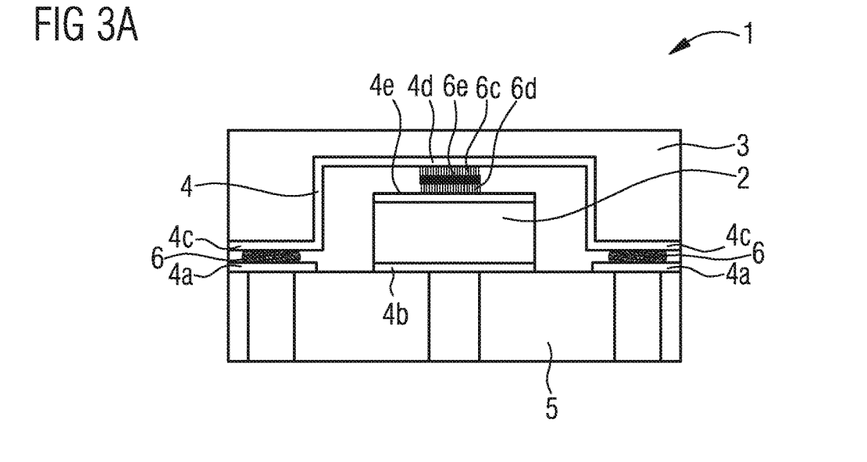

The exemplary embodiment shown in FIG. 3A differs from the exemplary embodiment shown in FIG. 2B in that a coating 4 covers an inner surface of the cover 3 facing the carrier 5 in an electrically conductive and/or thermally conductive manner at least in some areas.

Figure 3B:
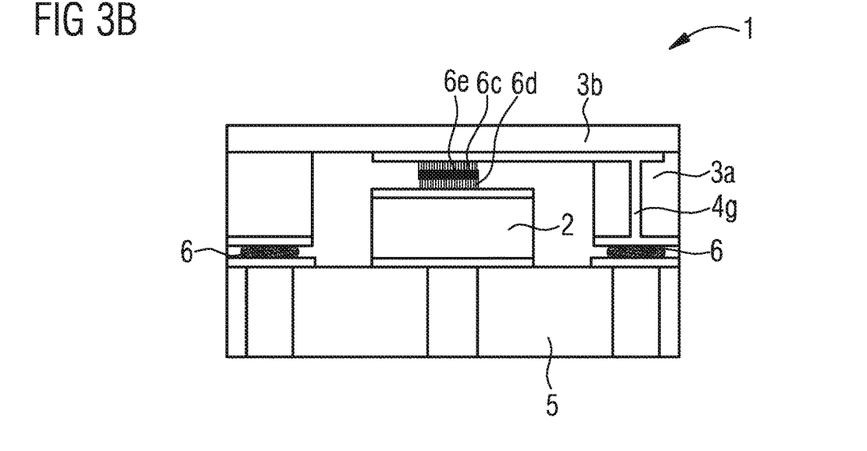

The exemplary embodiment shown in FIG. 3B differs from the exemplary embodiment shown in FIG. 3A in that the cover 3 is formed in two pieces and comprises a frame 3a and a cover plate 3b. In addition, the frame 3a is penetrated in the vertical direction by a contact 4g. On its inner surface, the cover partially has an electrically conductive and/or thermally conductive coating. The coating is continued on the cover plate so that it is in direct contact with the contact.

The coating and the contact thus form a thermally conductive and/or electrically conductive connection with the nanowires 6c, 6d.

Figure 3C:
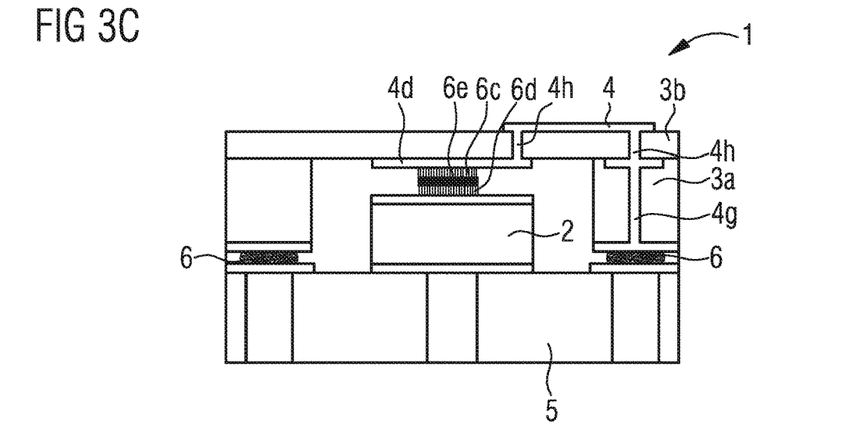

The exemplary embodiment shown in FIG. 3C differs from the exemplary embodiment shown in FIG. 3B in that the cover plate 3b is translucent. In addition, the contact 4g, which penetrates the frame in the vertical direction, is connected to a further contact 4h, which penetrates the cover plate 3b in the vertical direction. The coating 4 is partially arranged on the cover plate 3b. A further contact 4h, which also penetrates the cover plate 3b in vertical direction, is connected to the further second contact point 4d.

Figure 4A:
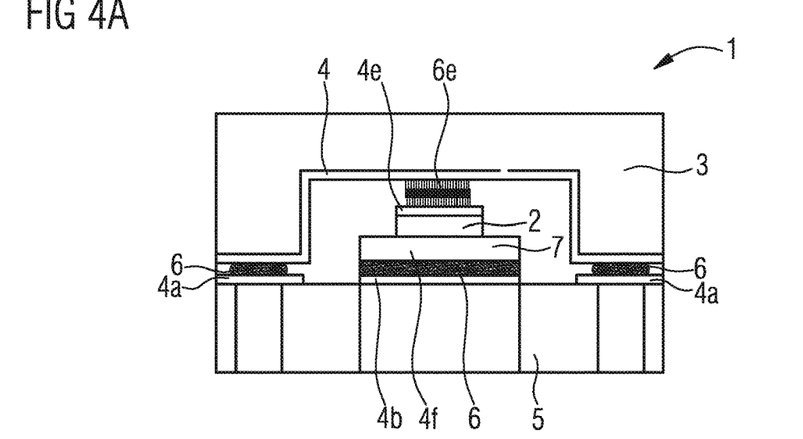

The exemplary embodiment shown in FIG. 4A differs from the exemplary embodiment shown in FIG. 3A in that the semiconductor chip 2 is arranged on a mounting element 7. The mounting element 7 has a fourth contact point 4f. The mounting element 7 is electrically conductively and/or thermally conductively connected to the carrier 5 via the fourth contact point 4f and the further first contact point 4b by means of a fifth and sixth plurality of nanowires.

Figure 4B:
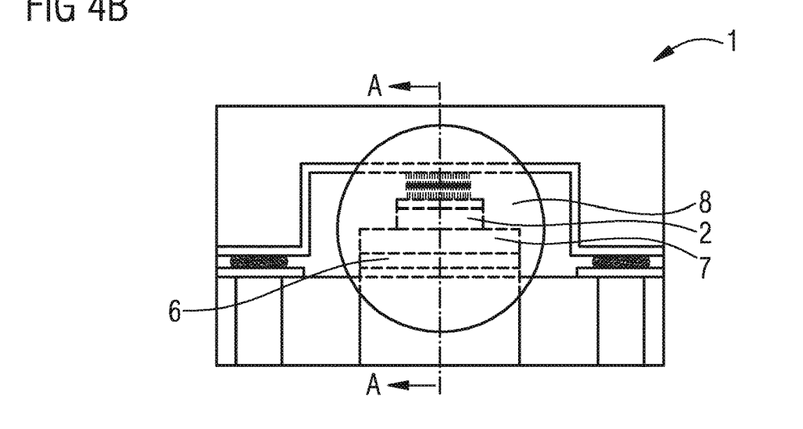

The exemplary embodiment shown in FIG. 4B differs from the exemplary embodiment shown in FIG. 4A in that an optical element 8 is arranged in front of a radiation exit surface 2a of the semiconductor chip 2.

Figure 4C:
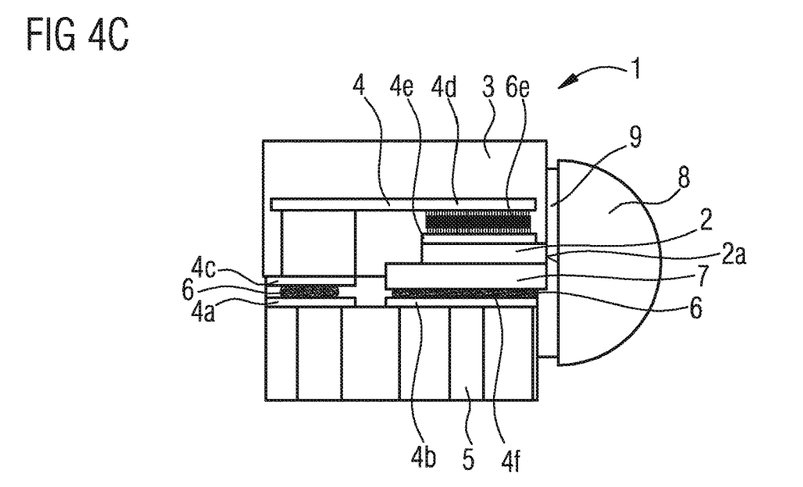

FIG. 4C shows a schematic sectional view of the component as shown in the exemplary embodiment of FIG. 4B along the section line A-A marked in FIG. 4A. An intermediate layer 9 is arranged between the semiconductor chip 2 and the optical element 8. The intermediate layer 9 provides the adhesion between the optical element 8 and a side surface which at least partially comprises a side surface of the semiconductor chip, a side surface of the cover, a side surface of the carrier and a side surface of the mounting element. The radiation exit surface 2a of the semiconductor chip 2 protrudes laterally beyond the cover 3 and the carrier 5.

Figure 5:
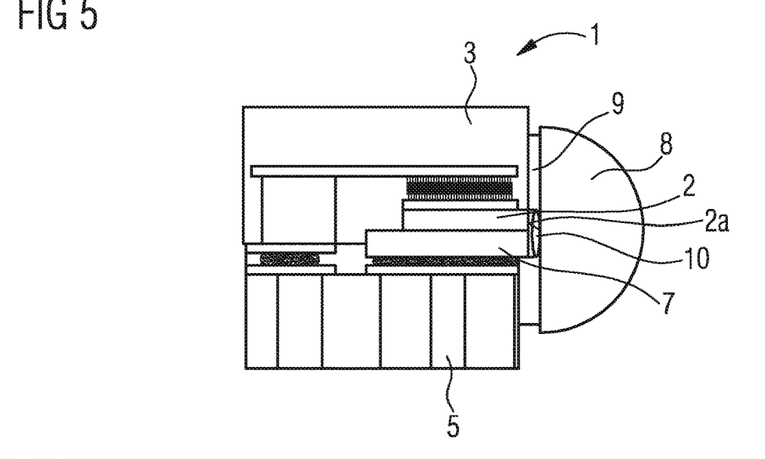

The exemplary embodiment shown in FIG. 5 differs from the exemplary embodiment shown in FIG. 4C in that a micro resonator 10 is embedded in the intermediate layer 9. The micro resonator 10 is arranged in front of the radiation exit surface 2a of the semiconductor chip 2. The micro resonator is configured as an optical resonance chamber for the electromagnetic radiation emitted by the semiconductor chip during operation.

Figure 6:
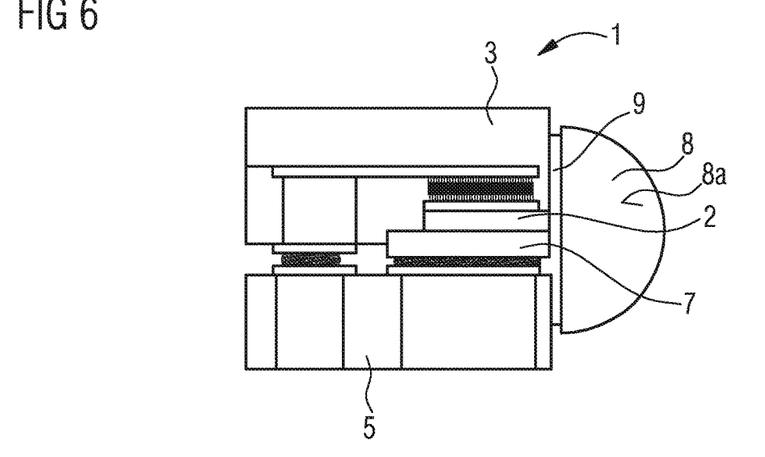

The exemplary embodiment shown in FIG. 6 differs from the exemplary embodiment shown in FIG. 4C in that the optical element 8 is covered by a conversion layer 8a. The conversion layer converts electromagnetic radiation of the semiconductor chip at least partially into electromagnetic radiation of another wavelength range.

Figure 7:
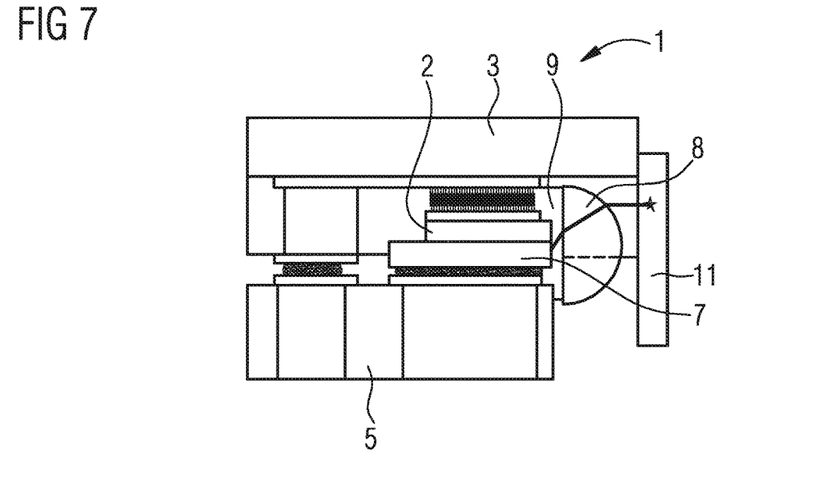

The exemplary embodiment shown in FIG. 7 differs from the exemplary embodiment shown in FIG. 4C in that the cover 3 protrudes laterally beyond the optical element 8. A conversion element 11 is attached to the protruding cover 3, which laterally covers the optical element 8. The conversion element at least partially converts electromagnetic radiation of the semiconductor chip into electromagnetic radiation of another wavelength range.

Figure 8:
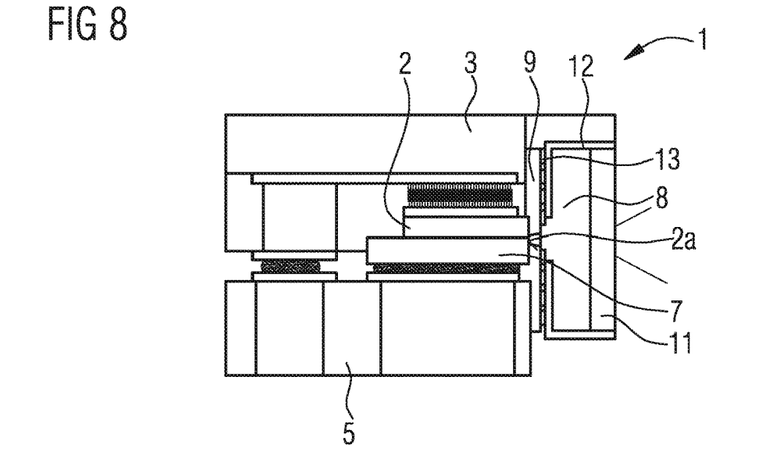

The exemplary embodiment shown in FIG. 8 differs from the exemplary embodiment shown in FIG. 4C in that the optical element 8 is surrounded by a holder 12. A dielectric filter 13 is arranged between the holder 12 and the intermediate layer 9. The holder 12 has a radiation entry surface opposite the radiation exit surface 2a of the semiconductor chip 2. A conversion element 11 is mounted on the radiation exit surface located opposite.

Figure 9:
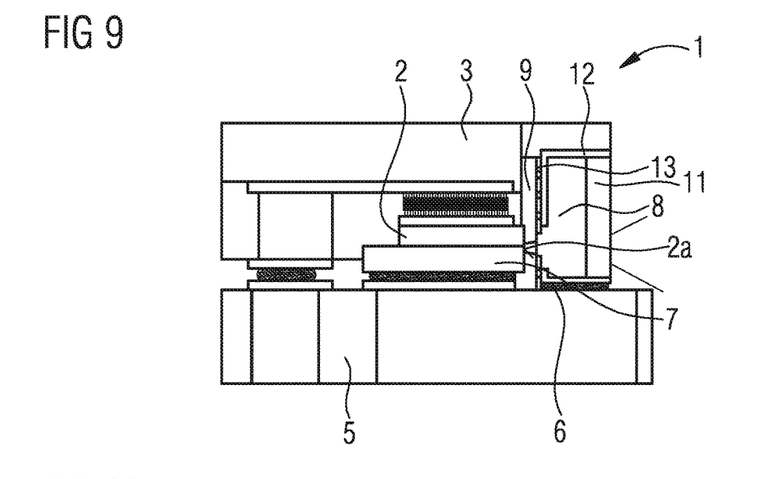

The exemplary embodiment shown in FIG. 9 differs from the exemplary embodiment shown in FIG. 8 in that the carrier 5 protrudes laterally beyond the radiation exit surface 2a. The holder 13 is thermally conductively connected to the carrier 5 by a seventh plurality of nanowires and an eighth plurality of nanowires.

Figure 10:
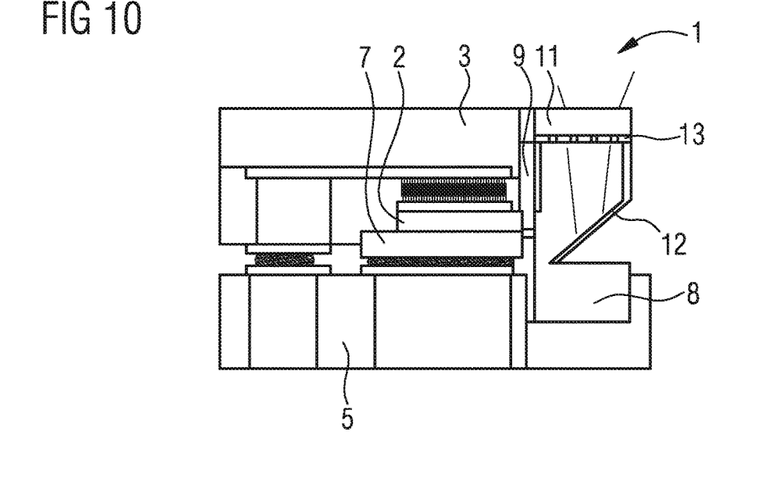

The exemplary embodiment shown in FIG. 10 differs from the exemplary embodiment shown in FIG. 8 in that the dielectric filter 13 is arranged on the radiation exit surface of the holder 12. The conversion element 11 is arranged on the dielectric filter 13. The holder 12 has a slope which deflects the electromagnetic radiation emitted during operation of the semiconductor chip 2 perpendicularly to the radiation exit surface 2a. The radiation exit surface of the holder is parallel to the main plane of extension of the component. A lower part of the optical element 8 is not enclosed by the holder 12. A part of the electromagnetic radiation emitted during operation can enter the lower part of the optical element 8. The lower part of the optical element 8 can be used, for example, as a light mixer or for thermal decoupling.

This patent application claims the priority of the German patent application 10 2018 106 959.6, the disclosure content of which is hereby incorporated by reference.

The invention is not limited to the description based on the exemplary embodiments. Rather, the invention comprises each new feature as well as each combination of features, which in particular includes each combination of features in the claims, even if this feature or this combination itself is not explicitly stated in the claims or the exemplary embodiments.

LIST OF REFERENCE SIGNS 1 optoelectronic component
2 radiation-emitting semiconductor chip
2a radiation exit surface
3 cover
3a frame
3b cover plate
33 cavity
4 coating
4a first contact points
4b further first contact point
4c second contact points
4d further second contact point
4e third contact point
4f fourth contact point
4g contact
4h further contact
5 carrier
5a plated-through holes
6 complete connection
6a first plurality of nanowires
6b second plurality of nanowires
6c third plurality of nanowires
6d fourth plurality of nanowires
6e incomplete connection
7 mounting element
8 optical element
8a conversion layer
9 intermediate layer
10 micro resonator
11 conversion element
12 holder
13 dielectric mirror

The invention claimed is:

1. An optoelectronic component comprising:
a radiation-emitting semiconductor chip, which emits electromagnetic radiation from a radiation exit surface during operation,
a carrier comprising at least two first contact points,
a cover comprising at least two second contact points, and
a third contact point arranged on a top surface of the semiconductor chip, wherein
the cover comprises a cavity,
a top surface delimiting the cavity of the cover faces the semiconductor chip and is arranged perpendicular to the radiation exit surface of the semiconductor chip,
the at least two first contact points and the at least two second contact points are electrically conductively and/or thermally conductively connected to one another by a first plurality of nanowires and a second plurality of nanowires,
the top surface delimiting the cavity has a further second contact point,
the further second contact point and the third contact point are electrically conductively and/or thermally conductively connected to one another by a third plurality of nanowires and a fourth plurality of nanowires, and
the nanowires provide a mechanically stable connection between the carrier and the cover.

2. The optoelectronic component according to claim 1, in which
the first contact points comprise the first plurality of nanowires and the second contact points comprise the second plurality of nanowires, wherein
the first plurality of nanowires and the second plurality of nanowires are inserted into one another along a main direction of extension so that the mechanically stable connection is mediated.

3. The optoelectronic component according to claim 1, in which the nanowires have one of the following materials: copper, gold, silver, platinum, nickel, tin.

4. The optoelectronic component according to claim 1, in which a distance from the further second contact point to the third contact point is different from the distance of the at least two first contact points to the at least two second contact points.

5. The optoelectronic component according to claim 1, in which
the semiconductor chip is arranged on a mounting element,
the mounting element has a fourth contact point on a side facing away from the semiconductor chip,
the carrier has a further first contact point, and
the further first contact point and the fourth contact point are electrically conductively and/or thermally conductively connected to one another by a fifth plurality of nanowires and a sixth plurality of nanowires.

6. The optoelectronic component according to claim 5, wherein
a coating covers an inner side of the cover facing the carrier in an electrically conductive and/or thermally conductive manner at least in some areas, wherein
the second contact points and the further second contact point are part of the coating.

7. The optoelectronic component according to claim 6, in which the inner surface of the cover is completely covered by the coating.

8. The optoelectronic component according to claim 1, in which
the cover has a frame, which laterally surrounds the semiconductor chip, and
the cover has a cover plate which is arranged on the frame.

9. The optoelectronic component according to claim 8, in which
a contact completely penetrates the frame in vertical direction, wherein
the contact connects at least one of the second contact points and the further second contact point in an electrically conductive and/or thermally conductive manner.

10. The optoelectronic component according to claim 8, in which the cover plate is transparent to visible light.

11. The optoelectronic component according to claim 1, in which
the semiconductor chip is an edge-emitting semiconductor laser chip, and
an optical element is attached to the radiation exit surface by means of an intermediate layer.

12. The optoelectronic component according to claim 11, in which a micro resonator is embedded in the intermediate layer.

13. The optoelectronic component according to claim 11, in which
an outer surface of the optical element is covered with a conversion layer.

14. The optoelectronic component according to claim 1, wherein the optoelectronic component
comprises a dielectric filter and a holder, wherein
the holder has a radiation entrance surface and a radiation exit surface, and
the dielectric filter is transparent to the electromagnetic radiation of the semiconductor chip and opaque to a converted radiation of another wavelength range.

15. The optoelectronic component according to claim 14, wherein
the dielectric filter is arranged on the radiation entrance surface or the radiation exit surface of the holder, and
a conversion element is arranged at the radiation exit surface of the holder, which at least partially converts electromagnetic radiation of the semiconductor chip into electromagnetic radiation of another wavelength range.

16. The optoelectronic component according to claim 14, in which
the carrier projects laterally beyond the radiation exit surface, and
the holder and the carrier are thermally conductively connected to one another by a seventh plurality of nanowires and an eighth plurality of nanowires.

17. A method for producing an optoelectronic component with the following steps:
providing a carrier comprising at least two first contact points,
applying a radiation-emitting semiconductor chip, which emits electromagnetic radiation from a radiation exit surface during operation, to the carrier,
applying a cover comprising at least two second contact points to the carrier, wherein
the at least two first contact points and two second contact points are electrically conductively and/or thermally conductively connected to one another by a first plurality of nanowires and a second plurality of nanowires, and
the first plurality of nanowires and the second plurality (6b) of nanowires provide a mechanically stable connection between the carrier and the cover.

18. The method according to claim 17, wherein
the first plurality of nanowires and the second plurality of nanowires are pressed together at room temperature with a pressure in the vertical direction of between 1 MPa and 50 MPa inclusive for a period of between 0.5 s and 5 s inclusive when the cover is applied to the carrier.

19. An optoelectronic component comprising:
a radiation-emitting semiconductor chip, which emits electromagnetic radiation from a radiation exit surface during operation,
a carrier comprising at least two first contact points, and
a cover comprising at least two second contact points, and
a third contact point arranged on a top surface of the semiconductor chip, wherein
the cover comprises a cavity,
a top surface delimiting the cavity of the cover faces the semiconductor chip and is arranged perpendicular to the radiation exit surface of the semiconductor chip,
the at least two first contact points and the at least two second contact points are electrically conductively and/or thermally conductively connected to one another by a first plurality of nanowires and a second plurality of nanowires,
the top surface delimiting the cavity has a further second contact point,
the further second contact point and the third contact point are electrically conductively and/or thermally conductively connected to one another by a third plurality of nanowires and a fourth plurality of nanowires, and
the nanowires provide a mechanically stable connection between the carrier and the cover.

* * * * *